(12) United States Patent
Kim et al.

(10) Patent No.: US 10,530,341 B2
(45) Date of Patent: Jan. 7, 2020

(54) SEMICONDUCTOR DEVICE AND OPERATING METHOD THEREOF

(71) Applicant: Sk hynix Inc., Gyeonggi-do (KR)

(72) Inventors: Woongrae Kim, Gyeonggi-do (KR); Tae-Yong Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/033,816

(22) Filed: Jul. 12, 2018

(65) Prior Publication Data

US 2019/0165767 A1 May 30, 2019

(30) Foreign Application Priority Data

Nov. 28, 2017 (KR) .................. 10-2017-0160650

(51) Int. Cl.
*H03K 3/012* (2006.01)
*H03K 17/687* (2006.01)

(52) U.S. Cl.
CPC .......... *H03K 3/012* (2013.01); *H03K 17/687* (2013.01); *H03K 2217/0036* (2013.01); *H03K 2217/0054* (2013.01)

(58) Field of Classification Search
CPC ............ G06F 1/26; G06F 1/32; G06F 1/3203; H03K 3/012
USPC ................................. 327/142, 143
See application file for complete search history.

(56) References Cited

U.S. PATENT DOCUMENTS

2007/0005995 A1*  1/2007  Kardach ............... G06F 1/3203
                                                  713/300
2012/0042188 A1*  2/2012  Hirano ................. H03K 17/223
                                                  713/324

FOREIGN PATENT DOCUMENTS

KR    1020080099623    11/2008
KR    1020100062518     6/2010
KR    1020140017863     2/2014

* cited by examiner

*Primary Examiner* — Tomi Skibinski
(74) *Attorney, Agent, or Firm* — IP & T Group LLP

(57) ABSTRACT

A semiconductor device includes a first internal circuit coupled to first and second voltage terminals for receiving first and second voltages; a second internal circuit coupled to the first and second voltage terminals for receiving the first and second voltages; a first power gating circuit coupled between at least one of the first and second voltage terminals and the first internal circuit, the first power gating circuit being suitable for disconnecting at least one of the first and second voltages based on a first mode signal in a first mode; a second power gating circuit coupled between at least one of the first and second voltage terminals and the second internal circuit, the second power gating circuit being suitable for disconnecting at least one of the first and second voltages based on an integrated mode signal in the first mode and a second mode; and a control circuit suitable for generating the first mode signal and the integrated mode signal.

20 Claims, 6 Drawing Sheets

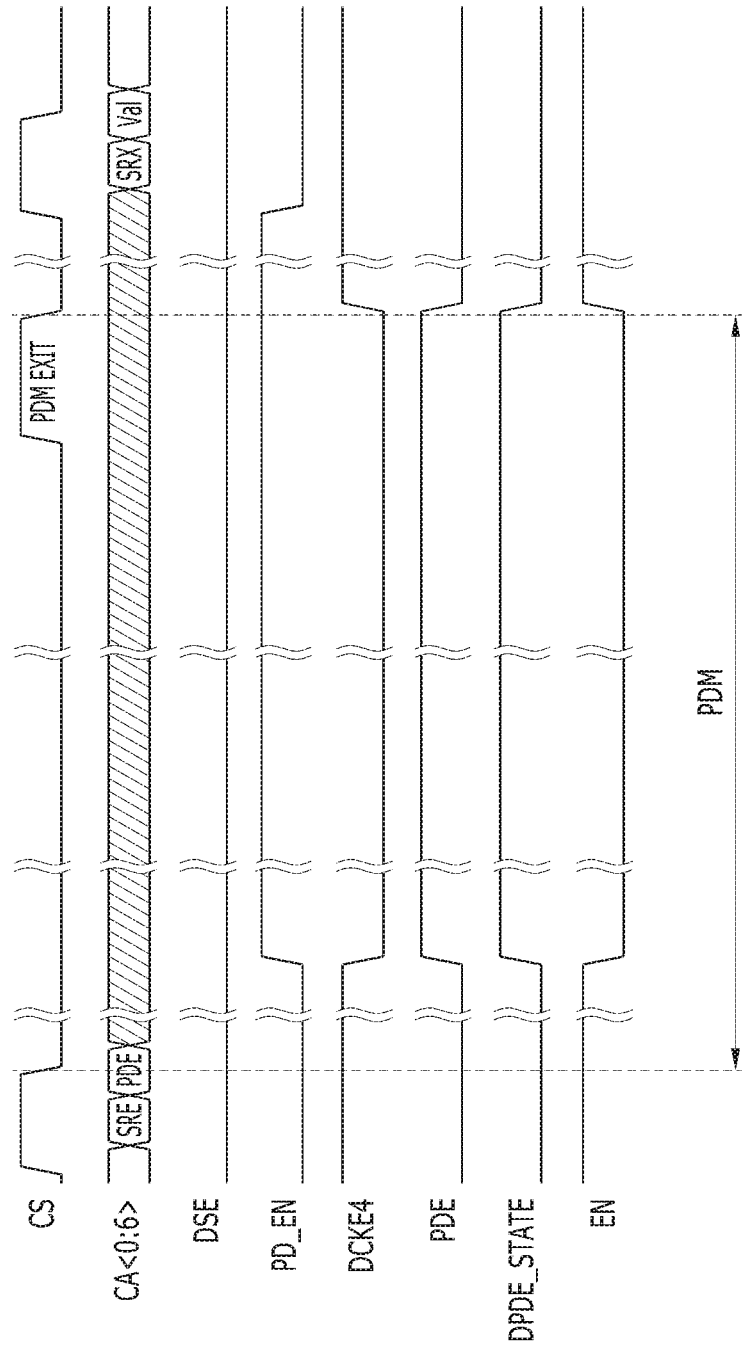

SEMICONDUCTOR DEVICE AND OPERATING METHOD THEREOF

CROSS-REFERENCE TO RELATED APPLICATIONS

This application claims priority under 35 U.S.C. § 119 to Korean Patent Application No. 10-2017-0160650, filed on Nov. 28, 2017, the disclosure of which is incorporated herein by reference in its entirety.

BACKGROUND

1. Field

Various embodiments of the present invention relate to a semiconductor design technique, and more particularly, to a semiconductor device and an operating method of the same.

2. Description of the Related Art

Generally, a semiconductor device may include a power gating circuit to minimize power consumption. The power gating circuit may reduce power consumption by electrically disconnecting an internal circuit of the semiconductor device from a supply terminal of a power supply voltage when the semiconductor device enters a mode in which unnecessary power consumption may occur.

SUMMARY

Various embodiments of the present invention are directed to a semiconductor device and an operating method thereof supporting power-down and deep-sleep modes.

Also, various embodiments of the present invention are directed to a semiconductor device and an operating method thereof supporting deep-sleep and power-down modes with a reduced number of commands and or address signals.

In accordance with an embodiment of the present invention, a semiconductor device may include: a first internal circuit coupled to first and second voltage terminals for receiving first and second voltages; a second internal circuit coupled to the first and second voltage terminals for receiving the first and second voltages; a first power gating circuit coupled between at least one of the first and second voltage terminals and the first internal circuit, the first power gating circuit being suitable for disconnecting at least one of the first and second voltages based on a first mode signal in a first mode; a second power gating circuit coupled between at least one of the first and second voltage terminals and the second internal circuit, the second power gating circuit being suitable for disconnecting at least one of the first and second voltages based on an integrated mode signal in the first mode and a second mode; and a control circuit suitable for generating the first mode signal and the integrated mode signal.

The first mode may include a deep-sleep mode, and the second mode includes a power-down mode.

The control circuit may include: a command decoding block suitable for generating the first mode signal corresponding to the first mode and a second mode signal corresponding to the second mode based on the one or more command signals, a first mode termination signal, a second mode start signal and a second mode termination signal; and an integrated mode control block suitable for generating the integrated mode signal, the first mode termination signal, the second mode start signal and the second mode termination signal based on a first command signal among one or more command signals, the first mode signal and the second mode signal.

The integrated mode control block may determine an activation moment of the first mode termination signal, an activation moment of the second mode start signal, an activation moment of the second mode termination signal and a deactivation moment of the integrated mode signal depending on a number of times that the first command signal toggles when the integrated mode signal is activated.

The integrated mode control block may include: a mode enable unit suitable for generating a mode enable signal based on the first mode signal and the second mode signal; an integrated mode signal generation unit suitable for generating the integrated mode signal based on the mode enable signal, a toggling detection signal and a mode state signal; a detection unit suitable for generating the toggling detection signal and an edge detection signal which correspond to the first command signal based on the integrated mode signal, the first mode signal and the first command signal; and a mode state determination unit suitable for generating the mode state signal, the first mode termination signal, the second mode start signal and the second mode termination signal based on the integrated mode signal, the first mode signal and the edge detection signal.

The detection unit may be enabled based on the integrated mode signal, detects toggling of the first command signal regardless of the first mode signal to generate the toggling detection signal, and detects an edge of the first command signal to generate the edge detection signal when the first mode signal is activated.

The semiconductor device may further include: a first buffer circuit suitable for buffering a first external command signal to generate the first command signal; a second buffer circuit enabled based on a buffer enable signal, the second buffer circuit being suitable for buffering one or more second external command signals to generate a second command signal among the one or more command signals; and a buffer enable circuit suitable for generating the buffer enable signal based on the integrated mode signal.

The buffer enable circuit may deactivate the buffer enable signal when the integrated mode signal is activated, and activate the buffer enable signal when the integrated mode signal is deactivated.

The first internal circuit may include a plurality of logic blocks coupled between a third voltage terminal to which the first voltage is supplied through the first power gating circuit and the second voltage terminal.

The first power gating circuit may include a switching block coupled between the first voltage terminal and the third voltage terminal, and the switching block electrically disconnects the first voltage terminal from the third voltage terminal based on the first mode signal or an inverted signal of the first mode signal.

The second internal circuit may include a plurality of logic blocks coupled between a fourth voltage terminal to which the first voltage is supplied through the second power gating circuit and the second voltage terminal.

The second power gating circuit may include a switching block coupled between the first voltage terminal and the fourth voltage terminal, and the switching block may electrically disconnect the first voltage terminal from the fourth voltage terminal based on the integrated mode signal or an inverted signal of the integrated mode signal.

The semiconductor device may further include: a third internal circuit coupled to the first and second voltage terminals for receiving the first and second voltages; a third power gating circuit coupled between the first voltage terminal and the third internal circuit, the third power gating circuit being suitable for disconnecting the first voltage in the first and second modes based on any one of the integrated mode signal and an inverted signal of the integrated mode signal; and a fourth power gating circuit coupled between the second voltage terminal and the third internal circuit the fourth power gating circuit being suitable for disconnecting the second voltage in the first and second modes based on remaining one of the integrated mode signal and the inverted signal of the integrated mode signal.

The third internal circuit may include: a plurality of first logic blocks coupled between a fifth voltage terminal to which the first voltage is supplied through the third power gating circuit and the second voltage terminal; and a plurality of second logic blocks coupled between a sixth voltage terminal to which the second voltage is supplied through the fourth power gating circuit and the second voltage terminal.

The third power gating circuit may include a switching block coupled between the first voltage terminal and the fifth voltage terminal, and the switching block may electrically disconnect the first voltage terminal from the fifth voltage terminal based on any one of the integrated mode signal and the inverted signal of the integrated mode signal.

The fourth power gating circuit may include a switching block coupled between the second voltage terminal and the sixth voltage terminal, and the switching block may electrically disconnect the second voltage terminal from the sixth voltage terminal based on remaining one of the integrated mode signal and the inverted signal of the integrated mode signal.

In accordance with an embodiment of the present invention, an operating method of a semiconductor device may include: electrically disconnecting a first voltage terminal from a first internal circuit and the first voltage terminal from a second internal circuit when the semiconductor device enters a first mode based on one or more command signals; electrically coupling the first voltage terminal to the first internal circuit and maintaining a state where the first voltage terminal is electrically disconnected from the second internal circuit when the semiconductor device exits from the first mode and enters a second mode based on first toggling of a first command signal among the one or more command signals; and maintaining a state where the first voltage terminal is electrically coupled to the first internal circuit and electrically coupling the first voltage terminal to the second internal circuit when the semiconductor device exits from the second mode based on second toggling of the first command signal.

When the first command signal performs the first toggling, the semiconductor device may enter the second mode based on a first edge of the first command signal, and subsequently exit from the first mode based on a second edge of the first command signal.

The first mode may include a deep-sleep mode, and the second mode may include a power-down mode.

Buffering command signals other than the first command signal among the one or more command signals inputted from an external device is disabled from when entering the first mode to when exiting from the second mode.

BRIEF DESCRIPTION OF THE DRAWINGS

FIGS. 4 to 6 are timing diagrams illustrating an operating method of a semiconductor device in accordance with an embodiment of the present invention.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples of the inventive concepts and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

In the following description, numerous specific details are set forth in order to provide a thorough understanding of the present invention. The present invention may be practiced without some or all these specific details. In other instances, well-known process structures and/or processes have not been described in detail in order not to unnecessarily obscure the present invention.

Figure 1:
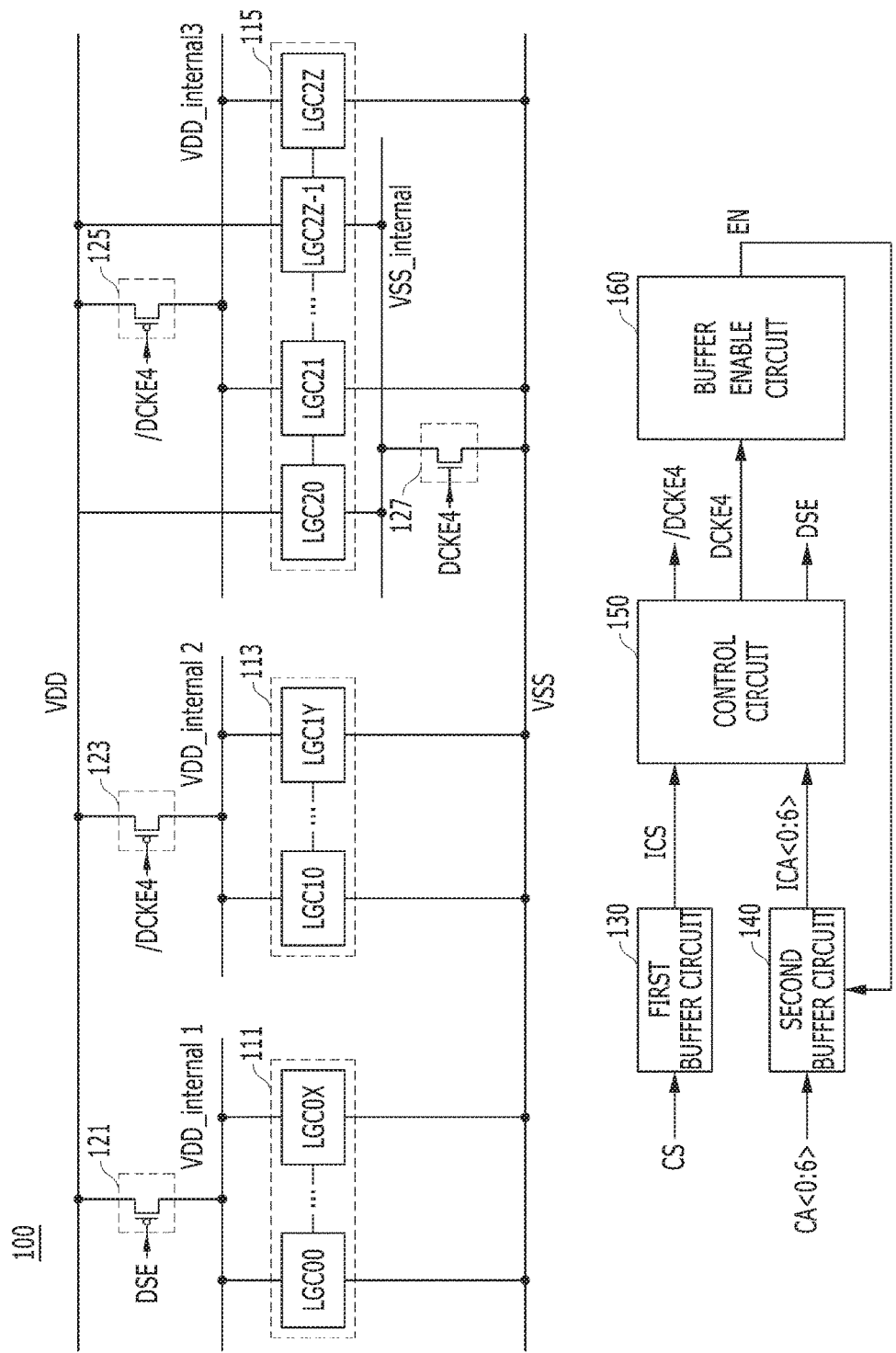
FIG. 1 is a block diagram illustrating a semiconductor device in accordance with an embodiment of the present invention.

It is also noted, that in some instances, as would be apparent to those skilled in the relevant art, a feature or element described in connection with one embodiment may be used singly or in combination with other features or elements of another embodiment, unless otherwise specifically indicated FIG. 1 is a block diagram illustrating a semiconductor device 100 in accordance with an embodiment of the present invention.

Referring to FIG. 1, the semiconductor device 100 may include a supply terminal of a power supply voltage VDD, a supply terminal of a first high voltage VDD_internal1, a supply terminal of a second high voltage VDD_internal2, a supply terminal of a third high voltage VDD_internal3, a supply terminal of a ground voltage VSS, and a supply terminal of a low voltage VSS_internal. Also, the semiconductor device 100 may include a first internal circuit 111, a second internal circuit 113, a third internal circuit 115, a first power gating circuit 121, a second power gating circuit 123, a third power gating circuit 125, a fourth power gating circuit 127, a first buffer circuit 130, a second buffer circuit 140, a control circuit 150, and a buffer enable circuit 160.

The power supply voltage VDD may be applied to the supply terminal of the power supply voltage VDD from an external device through a pad (not illustrated). Any suitable pad may be used.

The supply terminal of the first high voltage VDD_internal1 may receive the first high voltage VDD_internal1 having a similar voltage level to the power supply voltage VDD through the first power gating circuit 121 or may float by the first power gating circuit 121.

The supply terminal of the second high voltage VDD_internal2 may receive the second high voltage VDD_internal2 having a similar voltage level to the power supply voltage VDD through the second power gating circuit 123 or may float by the second power gating circuit 123.

The supply terminal of the third high voltage VDD_internal3 may receive the third high voltage VDD_internal3 having a similar voltage level to the power supply voltage VDD through the third power gating circuit 125 or may float by the third power gating circuit 125.

The ground voltage VSS may be applied to the supply terminal of the ground voltage VSS from the external device through a pad (not illustrated). Any suitable pad may be used.

The supply terminal of the low voltage VSS_internal may receive the low voltage VSS_internal having a similar voltage level to the ground voltage VSS through the fourth power gating circuit 127 or may float by the fourth power gating circuit 127.

The first internal circuit 111 may be coupled between the supply terminal of the first high voltage VDD_internal1 and the supply terminal of the ground voltage VSS. The first internal circuit 111 may be indirectly coupled to the supply terminal of the power supply voltage VDD through the first power gating circuit 121, and be directly coupled to the supply terminal of the ground voltage VSS. The first internal circuit 111 may receive the first high voltage VDD_internal1 and the ground voltage VSS to perform a predetermined operation. For example, the first internal circuit 111 may include a plurality of logic blocks, e.g., logic blocks LGC00 to LGC0X which are coupled between the supply terminal of the first high voltage VDD_internal1 and the supply terminal of the ground voltage VSS. The number of logic blocks is not limited to two logic blocks as illustrated in the embodiment of FIG. 1. Any suitable number of logic blocks may be used without departing from the spirit and scope of the present invention.

The second internal circuit 113 may be coupled between the supply terminal of the second high voltage VDD_internal2 and the supply terminal of the ground voltage VSS. The second internal circuit 113 may be indirectly coupled to the supply terminal of the power supply voltage VDD through the second power gating circuit 123, and be directly coupled to the supply terminal of the ground voltage VSS. The second internal circuit 113 may receive the second high voltage VDD_internal2 and the ground voltage VSS to perform a predetermined operation. For example, the second internal circuit 113 may include a plurality of logic blocks, e.g., logic blocks LGC10 to LGC1Y coupled between the supply terminal of the second high voltage VDD_internal2 and the supply terminal of the ground voltage VSS. The number of logic blocks is not limited to two logic blocks as illustrated in the embodiment of FIG. 1. Any suitable number of logic blocks may be used without departing from the spirit and scope of the present invention.

The third internal circuit 115 may be coupled to the supply terminal of the power supply voltage VDD, the supply terminal of the third high voltage VDD_internal3, the supply terminal of the ground voltage VSS and the supply terminal of the low voltage VSS_internal. The third internal circuit 115 may receive the power supply voltage VDD, the third high voltage VDD_internal3, the ground voltage VSS and the low voltage VSS_internal to perform a predetermined operation. For example, the third internal circuit 115 may include a plurality of first logic blocks LGC20 to LGC2Z-1 and a plurality of second logic blocks LGC21 to LGC2Z. The first logic blocks LGC20 to LGC2Z-1 may be coupled between the supply terminal of the power supply voltage VDD and the supply terminal of the low voltage VSS_internal. The second logic blocks LGC21 to LGC2Z may be coupled between the supply terminal of the third high voltage VDD_internal3 and the supply terminal of the ground voltage VSS.

The first power gating circuit 121 may be coupled between the supply terminal of the power supply voltage VDD and the supply terminal of the first high voltage VDD_internal1. The first power gating circuit 121 may electrically disconnect the supply terminal of the power supply voltage VDD from the supply terminal of the first high voltage VDD_internal1 in a deep-sleep mode based on a first mode signal DSE. That is, the first power gating circuit 121 may disconnect the power supply voltage VDD supplied to the first internal circuit 111 in the deep-sleep mode. For example, the first power gating circuit 121 may include a switching element. The switching element may include a PMOS transistor having a gate that receives the first mode signal DSE, a source that is coupled to the supply terminal of the power supply voltage VDD and a drain that is coupled to the supply terminal of the first high voltage VDD_internal1.

The second power gating circuit 123 may be coupled between the supply terminal of the power supply voltage VDD and the supply terminal of the second high voltage VDD_internal2. The second power gating circuit 123 may electrically disconnect the supply terminal of the power supply voltage VDD from the supply terminal of the second high voltage VDD_internal2 in the deep-sleep mode and/or a power-down mode based on an inversion integrated mode signal /DCKE4. That is, the second power gating circuit 123 may disconnect the power supply voltage VDD supplied to the second internal circuit 113 in the deep-sleep mode and/or the power-down mode. For example, the second power gating circuit 123 may include a switching element. The switching element may include a PMOS transistor having a gate that receives the inversion integrated mode signal /DCKE4, a source that is coupled to the supply terminal of the power supply voltage VDD and a drain that is coupled to the supply terminal of the second high voltage VDD_internal2.

The third power gating circuit 125 may be coupled between the supply terminal of the power supply voltage VDD and the supply terminal of the third high voltage VDD_internal3. The third power gating circuit 125 may electrically disconnect the supply terminal of the power supply voltage VDD from the supply terminal of the third high voltage VDD_internal3 in the deep-sleep mode and/or the power-down mode based on the inversion integrated mode signal /DCKE4. That is, the third power gating circuit 125 may disconnect the power supply voltage VDD supplied to the third internal circuit 115 in the deep-sleep mode and/or the power-down mode. For example, the third power gating circuit 125 may include a switching element. The switching element may include a PMOS transistor having a gate that receives the inversion integrated mode signal /DCKE4, a source that is coupled to the supply terminal of the power supply voltage VDD and a drain that is coupled to the supply terminal of the third high voltage VDD_internal3.

The fourth power gating circuit 127 may be coupled between the supply terminal of the ground voltage VSS and the supply terminal of the low voltage VSS_internal. The fourth power gating circuit 127 may electrically disconnect the supply terminal of the ground voltage VSS from the supply terminal of the low voltage VSS_internal in the deep-sleep mode and/or the power-down mode based on an integrated mode signal DCKE4. That is, the fourth power gating circuit 127 may disconnect the ground voltage VSS supplied to the third internal circuit 115 in the deep-sleep mode and the power-down mode. For example, the fourth power gating circuit 127 may include a switching element. The switching element may include an NMOS transistor having a gate that receives the integrated mode signal DCKE4, a drain that is coupled to the supply terminal of the ground voltage VSS and a source that is coupled to the supply terminal of the low voltage VSS_internal.

The first buffer circuit 130 may buffer a first external command signal CS to generate a first internal command signal ICS. The first external command signal CS may include a chip selection signal. The first buffer circuit 130 may be enabled all the time without specific control.

The second buffer circuit 140 may buffer a plurality of second external command signals CA<0:6> to generate a plurality of second internal command signals ICA<0:6>. The second external command signals CA<0:6> may include a command signal and an address signal. The second buffer circuit 140 may be enabled or disabled based on a buffer enable signal EN. For example, the second buffer circuit 140 may be disabled in the deep-sleep mode and/or the power-down mode.

The control circuit 150 may generate the first mode signal DSE, the integrated mode signal DCKE4 and the inversion integrated mode signal /DCKE4 based on the first internal command signal ICS and the second internal command signals ICA<0:6>. For example, the control circuit 150 may activate the first mode signal DSE, the integrated mode signal DCKE4 and the inversion integrated mode signal /DCKE4 in the deep-sleep mode. The control circuit 150 may deactivate the first mode signal DSE and activate the integrated mode signal DCKE4 and the inversion integrated mode signal /DCKE4 in the power-down mode.

The buffer enable circuit 160 may generate the buffer enable signal EN based on the integrated mode signal DCKE4. For example, the buffer enable circuit 160 may deactivate the buffer enable signal EN when the integrated mode signal DCKE4 is activated, and activate the buffer enable signal EN when the integrated mode signal DCKE4 is deactivated.

Figure 2:
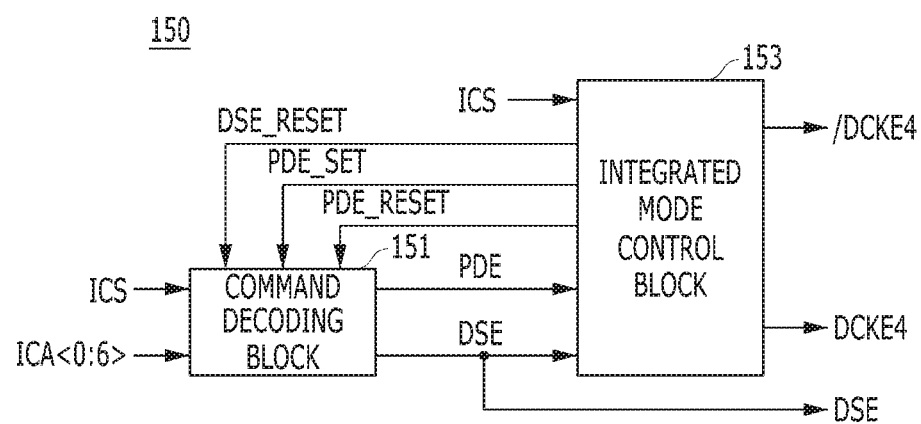
FIG. 2 is a block diagram illustrating an exemplary configuration of a control circuit in accordance with an embodiment of the present invention.

FIG. 2 is a block diagram illustrating an exemplary configuration of a control circuit in accordance with an embodiment of the present invention, for example, the control circuit 150 shown in FIG. 1.

Referring to FIG. 2, the control circuit 150 may include a command decoding block 151, and an integrated mode control block 153.

The command decoding block 151 may generate the first mode signal DSE corresponding to the deep-sleep mode and a second mode signal PDE corresponding to the power-down mode based on the first internal command signal ICS, the second internal command signals ICA<0:6>, a first mode termination signal DSE_RESET, a second mode start signal PDE_SET and a second mode termination signal PDE_RESET. For example, the command decoding block 151 may generate the first mode signal DSE and the second mode signal PDE based on Table 1 below.

TABLE 1

| Mode | CS | CA<0> | CA<1> | CA<2> | CA<3> | CA<4> | CA<5> | CA<6> |
|---|---|---|---|---|---|---|---|---|
| POWER DOWN MODE entry | H | L | L | L | L | L | L | H |
| POWER DOWN MODE exit | H | L | L | L | L | L | L | L |
| SELF REFRESH MODE entry | H | L | L | L | H | L | H | H |
| | X | V | V | V | V | V | DSM | PDM |

As shown in Table 1 above, the deep-sleep mode may enter a specific mode, and subsequently be initiated and exit as an option mode DSM. For example, the specific mode may include a self-refresh mode. Since the number of cases of a decoding result is limited as the limited number of signals CS, CA<0:6> is used, the first deep-sleep mode may not be independently controlled but may dependently controlled as the option mode DSM. In this case, the command decoding block 151 may activate a refresh mode signal (not illustrated) corresponding to the self-refresh mode based on the first internal command signal ICS and the second internal command signals ICA<0:6>, which are inputted in advance, and subsequently may activate the first mode signal DSE based on the first internal command signal ICS and the second internal command signals ICA<0:6>, which are successively inputted. The command decoding block 151 may deactivate the first mode signal DSE based on the first mode termination signal DSE_RESET.

As shown in Table 1 above, the power-down mode may be initiated and exited based on the first internal command signal ICS and the second internal command signals ICA<0:6>. That is, the power-down mode may be independently controlled. In this case, the command decoding block 151 may activate and deactivate the second mode signal PDE corresponding to the power-down mode based on the first internal command signal ICS and the second internal command signals ICA<0:6>. The power-down mode may enter a specific mode, for example, the self-refresh mode, and subsequently be initiated and exited as an option mode PDM. That is, the power-down mode may be dependently controlled as the option mode PDM. In this case, the command decoding block 151 may activate the refresh mode signal (not illustrated) based on the first internal command signal ICS and the second internal command signals ICA<0:

6>, which are inputted in advance, and subsequently activate the second mode signal PDE based on the first internal command signal ICS and the second internal command signals ICA<0:6>, which are successively inputted. The command decoding block 151 may deactivate the second mode signal PDE based on the second mode termination signal PDE_RESET. The power-down mode may be interconnected, i.e., subsequent to the deep-sleep mode, thereby being initiated and exited. In this case, the command decoding block 151 may activate the second mode signal PDE based on the second mode start signal PDE_SET and deactivate the second mode signal PDE based on the second mode termination signal PDE_RESET.

The integrated mode control block 153 may generate the integrated mode signal DCKE4, the inversion integrated mode signal /DCKE4, the first mode termination signal DSE_RESET, the second mode start signal PDE_SET and the second mode termination signal PDE_RESET based on the first internal command signal ICS, the first mode signal DSE and the second mode signal PDE. For example, when the integrated mode signal DCKE4 is activated, the integrated mode control block 153 may determine an activation moment of the first mode termination signal DSE_RESET, an activation moment of the second mode start signal PDE_SET, an activation moment of the second mode termination signal PDE_RESET and a deactivation moment of the integrated mode signal DCKE4 depending on the number of times that the first internal command signal ICS toggles.

Figure 3:
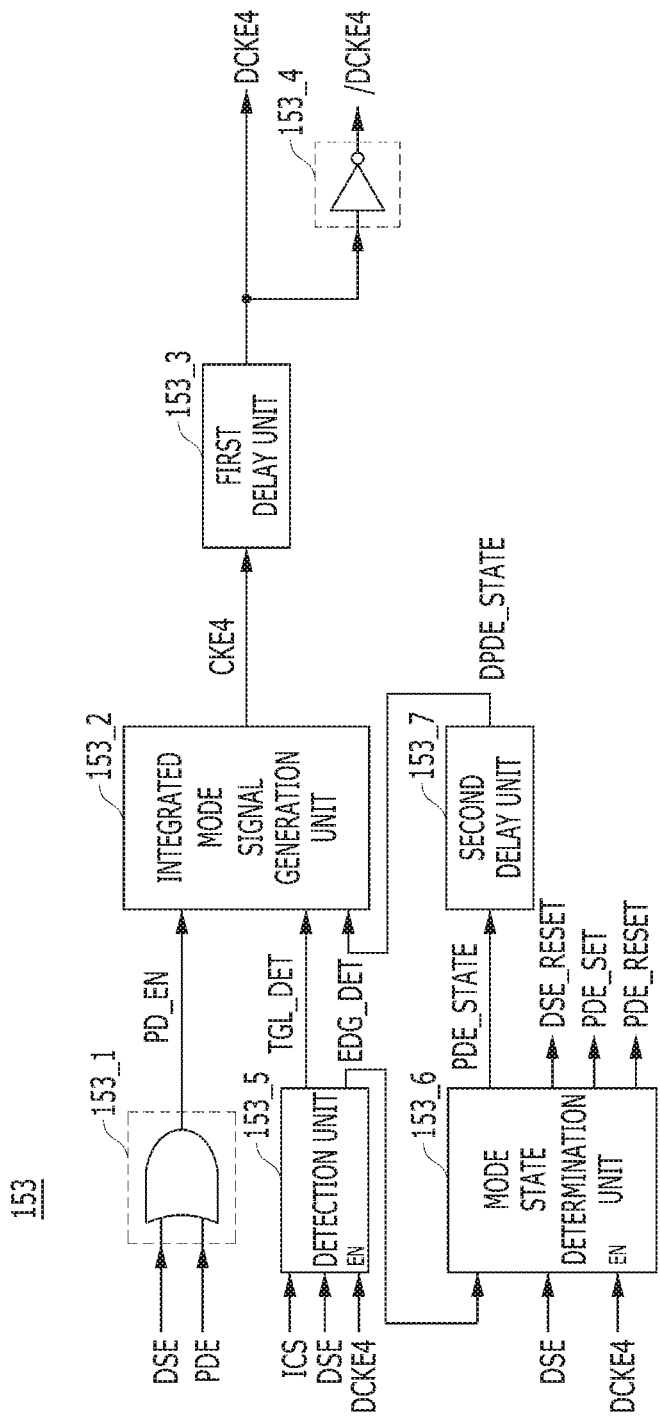
FIG. 3 is a block diagram illustrating an integrated mode control block in accordance with an embodiment of the present invention.

FIG. 3 is a block diagram illustrating an exemplary configuration of an integrated mode control block in accordance with an embodiment of the present invention, for example, the integrated mode control block 153 shown in FIG. 2.

Referring to FIG. 3, the integrated mode control block 153 may include a mode enable unit 153_1, an integrated mode signal generation unit 153_2, a first delay unit 153_3, an inversion unit 153_4, a detection unit 153_5, a mode state determination unit 153_6, and a second delay unit 153_7.

The mode enable unit 153_1 may generate a mode enable signal PD_EN based on the first mode signal DSE and the second mode signal PDE. For example, the mode enable unit 153_1 may include an OR gate.

The integrated mode signal generation unit 153_2 may generate an integrated mode output signal CKE4 based on the mode enable signal PD_EN, a toggling detection signal TGL_DET and a delayed mode state signal DPDE_STATE. For example, the integrated mode signal generation unit 153_2 may activate the integrated mode output signal CKE4 based on the mode enable signal PD_EN and deactivate the integrated mode output signal CKE4 based on the toggling detection signal TGL_DET and the delayed mode state signal DPDE_STATE. The integrated mode signal generation unit 153_2 may deactivate the integrated mode output signal CKE4 based on the toggling detection signal TGL_DET when the delayed mode state signal DPDE_STATE is activated. The integrated mode signal generation unit 153_2 may continuously activate the integrated mode output signal CKE4 regardless of the toggling detection signal TGL_DET when the delayed mode state signal DPDE_STATE is deactivated.

The first delay unit 153_3 may delay the integrated mode output signal CKE4 by a first delay time to generate the integrated mode signal DCKE4. The first delay unit 153_3 may include a configuration for securing operational margins of the detection unit 153_5, the mode state determination unit 153_6 and the buffer enable circuit 160. However, the first delay unit 153_3 may not be necessarily required.

The inversion unit 153_4 may invert the integrated mode signal DCKE4 to generate the inversion integrated mode signal /DCKE4. For example, the inversion unit 153_4 may include an inverter.

The detection unit 153_5 may generate the toggling detection signal TGL_DET and an edge detection signal EDG_DET which correspond to the first internal command signal ICS based on the integrated mode signal DCKE4, the first mode signal DSE and the first internal command signal ICS. For example, the detection unit 153_5 may be enabled based on the integrated mode signal DCKE4. The detection unit 153_5 may detect toggling of the first internal command signal ICS regardless of the first mode signal DSE to generate the toggling detection signal TGL_DET. In addition, the detection unit 153_5 may detect rising edges and falling edges of the first internal command signal ICS to generate the edge detection signal EDG_DET when the first mode signal DSE is activated.

The mode state determination unit 153_6 may generate a mode state signal PDE_STATE, the first mode termination signal DSE_RESET, the second mode start signal PDE_SET and the second mode termination signal PDE_RESET based on the integrated mode signal DCKE4, the first mode signal DSE and the edge detection signal EDG_DET. For example, the mode state determination unit 153_6 may be enabled based on the integrated mode signal DCKE4. The mode state determination unit 153_6 may activate the second mode start signal PDE_SET based on the edge detection signal EDG_DET corresponding to a first rising edge of the first internal command signal ICS. The mode state determination unit 153_6 may activate the first mode termination signal DSE_RESET and the mode state signal PDE_STATE based on the edge detection signal EDG_DET corresponding to a first falling edge of the first internal command signal ICS. The mode state determination unit 153_6 may deactivate the mode state signal PDE_STATE based on the edge detection signal EDG_DET corresponding to a second falling edge of the first internal command signal ICS. An activation time period of the mode state signal PDE_STATE may correspond to the power-down mode.

The second delay unit 153_7 may delay the mode state signal PDE_STATE by a second delay time to generate the delayed mode state signal DPDE_STATE. The second delay unit 153_7 may include a configuration for securing operational margins of the integrated mode signal generation unit 153_2 and the detection unit 153_5. In some embodiments, the second delay unit 153_7 may be optional.

Hereinafter, an operation of the semiconductor device 100 having the aforementioned structure in accordance with an embodiment of the present invention is described with reference to FIGS. 4 to 6.

Figure 4:
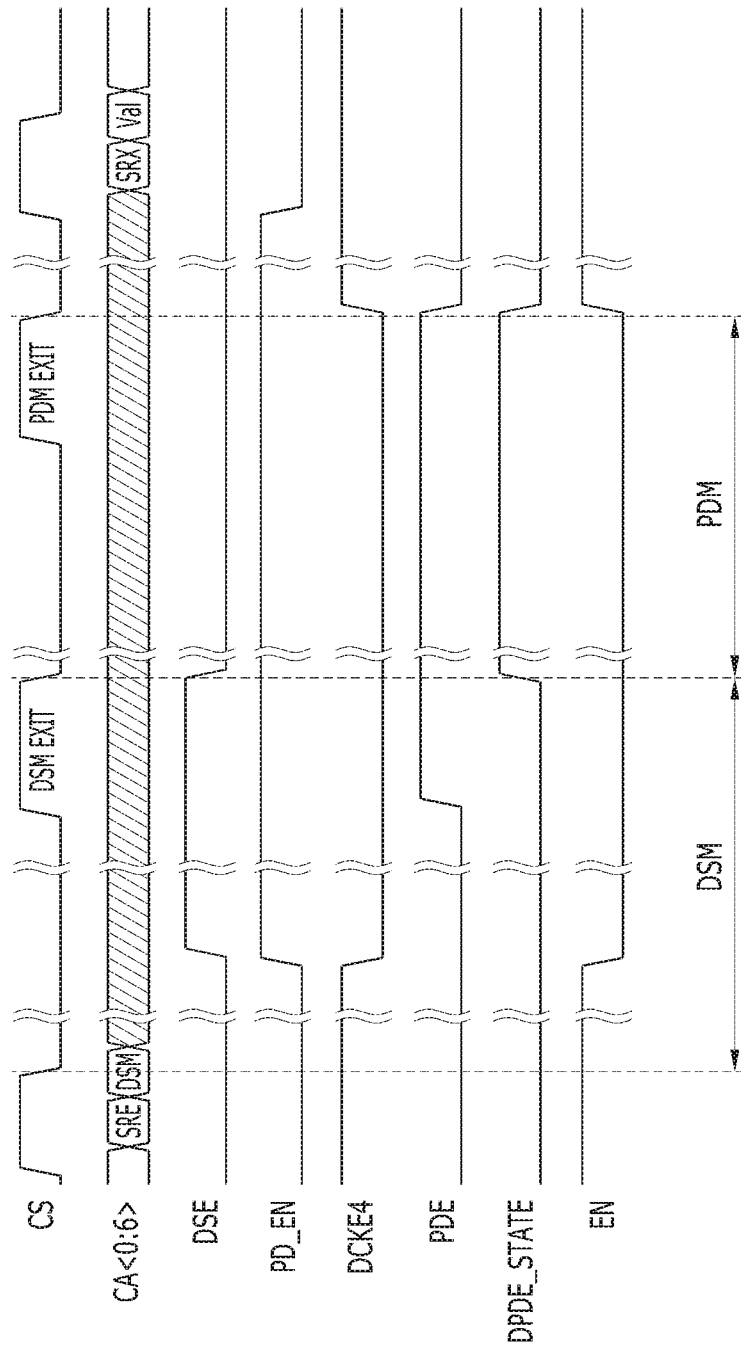

FIG. 4 is a timing diagram illustrating an operating method of the semiconductor device 100 shown in FIG. 1, when entering the deep-sleep mode DSM.

Referring to FIG. 4, in the deep-sleep mode DSM, the power-down mode may be interconnected. In other words, when the deep-sleep mode DSM is initiated, the semiconductor device 100 may enter the power-down mode PDM simultaneously while exiting from the deep-sleep mode DSM, corresponding to first toggling of the first internal command signal ICS corresponding to the first external command signal CS, and may exit from the power-down mode PDM, corresponding to second toggling of the first internal command signal ICS corresponding to the first external command signal CS.

An operation of the semiconductor device 100 according to the deep-sleep mode DSM may be as follows.

The deep-sleep mode DSM may be initiated as an option mode of a specific mode, for example, the self-refresh mode SRE. For example, the first and second buffer circuits 130 and 140 may buffer the first external command signal CS and the second external command signals CA<0:6> which correspond to the self-refresh mode SRE, respectively, thereby generating the first internal command signal ICS and the second internal command signals ICA<0:6> which correspond to the self-refresh mode SRE, respectively. Then, the first and second buffer circuits 130 and 140 may buffer the first external command signal CS and the second external command signals CA<0:6> which correspond to the deep-sleep mode DSM as the option mode of the self-refresh mode SRE, respectively, thereby generating the first internal command signal ICS and the second internal command signals ICA<0:6> which correspond to the deep-sleep mode DSM, respectively.

The control circuit 150 may generate the first mode signal DSE corresponding to the deep-sleep mode DSM, the integrated mode signal DCKE4 and the inversion integrated mode signal /DCKE4 corresponding to integrated modes including the deep-sleep mode and the power-down mode, based on the first internal command signal ICS and the second internal command signals ICA<0:6>. For example, the command decoding block 151 may activate the first mode signal DSE based on the first internal command signal ICS and the second internal command signals ICA<0:6>, and deactivate the first mode signal DSE based on the first mode termination signal DSE_RESET. The integrated mode control block 153 may activate the integrated mode signal DCKE4 and the inversion integrated mode signal /DCKE4 based on the first mode signal DSE, and sequentially activate the second mode start signal PDE_SET and the first mode termination signal DSE_RESET based on the first toggling of the first internal command signal ICS after the integrated mode signal DCKE4 is activated.

In the deep-sleep mode DSM, the first power gating circuit 121 may electrically disconnect the supply terminal of the power supply voltage VDD from the supply terminal of the first high voltage VDD_internal1 based on the first mode signal DSE. In the deep-sleep mode DSM, the second power gating circuit 123 may electrically disconnect the supply terminal of the power supply voltage VDD from the supply terminal of the second high voltage VDD_internal2 based on the inversion integrated mode signal /DCKE4. In the deep-sleep mode DSM, the third power gating circuit 125 may electrically disconnect the supply terminal of the power supply voltage VDD from the supply terminal of the third high voltage VDD_internal3 based on the inversion integrated mode signal /DCKE4. In the deep-sleep mode DSM, the fourth power gating circuit 127 may electrically disconnect the supply terminal of the ground voltage VSS from the supply terminal of the low voltage VSS_internal based on the integrated mode signal DCKE4. Accordingly, in the deep-sleep mode DSM, the power supply voltage VDD supplied to the first to third internal circuits 111, 113 and 115 may be disconnected, and the ground voltage VSS supplied to the third internal circuit 115 may be disconnected.

The buffer enable circuit 160 may deactivate the buffer enable signal EN based on the integrated mode signal DCKE4 in the deep-sleep mode DSM, and the second buffer circuit 140 may be disabled based on the buffer enable signal EN in the deep-sleep mode DSM.

An operation of the semiconductor device 100 according to the power-down mode PDM interconnected to the deep-sleep mode DSM may be as follows.

When the power-down mode PDM is interconnected to the deep-sleep mode DSM, the semiconductor device 100 may enter the power-down mode PDM when the integrated mode signal DCKE4 is activated and the first internal command signal ICS toggles firstly and may exit from the power-down mode PDM when the first internal command signal ICS toggles secondly. For example, the command decoding block 151 may activate the second mode signal PDE based on the second mode start signal PDE_SET and deactivate the second mode signal PDE based on the second mode termination signal PDE_RESET.

In the power-down mode PDM, the first power gating circuit 121 may electrically couple the supply terminal of the power supply voltage VDD to the supply terminal of the first high voltage VDD_internal1 based on the first mode signal DSE. In the power-down mode PDM, the second power gating circuit 123 may electrically disconnect the supply terminal of the power supply voltage VDD from the supply terminal of the second high voltage VDD_internal2 based on the inversion integrated mode signal /DCKE4. In the power-down mode PDM, the third power gating circuit 125 may electrically disconnect the supply terminal of the power supply voltage VDD from the supply terminal of the third high voltage VDD_internal3 based on the inversion integrated mode signal /DCKE4. In the power-down mode PDM, the fourth power gating circuit 127 may electrically disconnect the supply terminal of the ground voltage VSS from the supply terminal of the low voltage VSS_internal based on the integrated mode signal DCKE4. Accordingly, in the power-down mode PDM, the power supply voltage VDD may be supplied to the first internal circuit 111, and at least one of the power supply voltage VDD and the ground voltage VSS may not be continuously supplied to the second and third internal circuits 113 and 115.

The buffer enable circuit 160 may continuously deactivate the buffer enable signal EN based on the integrated mode signal DCKE4 in the power-down mode PDM, and the second buffer circuit 140 may be continuously disabled based on the buffer enable signal EN even in the power-down mode PDM.

Subsequently, when the power-down mode PDM exits, all of the power supply voltage VDD and the ground voltage VSS may be supplied to the first to third internal circuits 111, 113 and 115, and the second buffer circuit 140 may be enabled based on the buffer enable signal EN.

Figure 5:
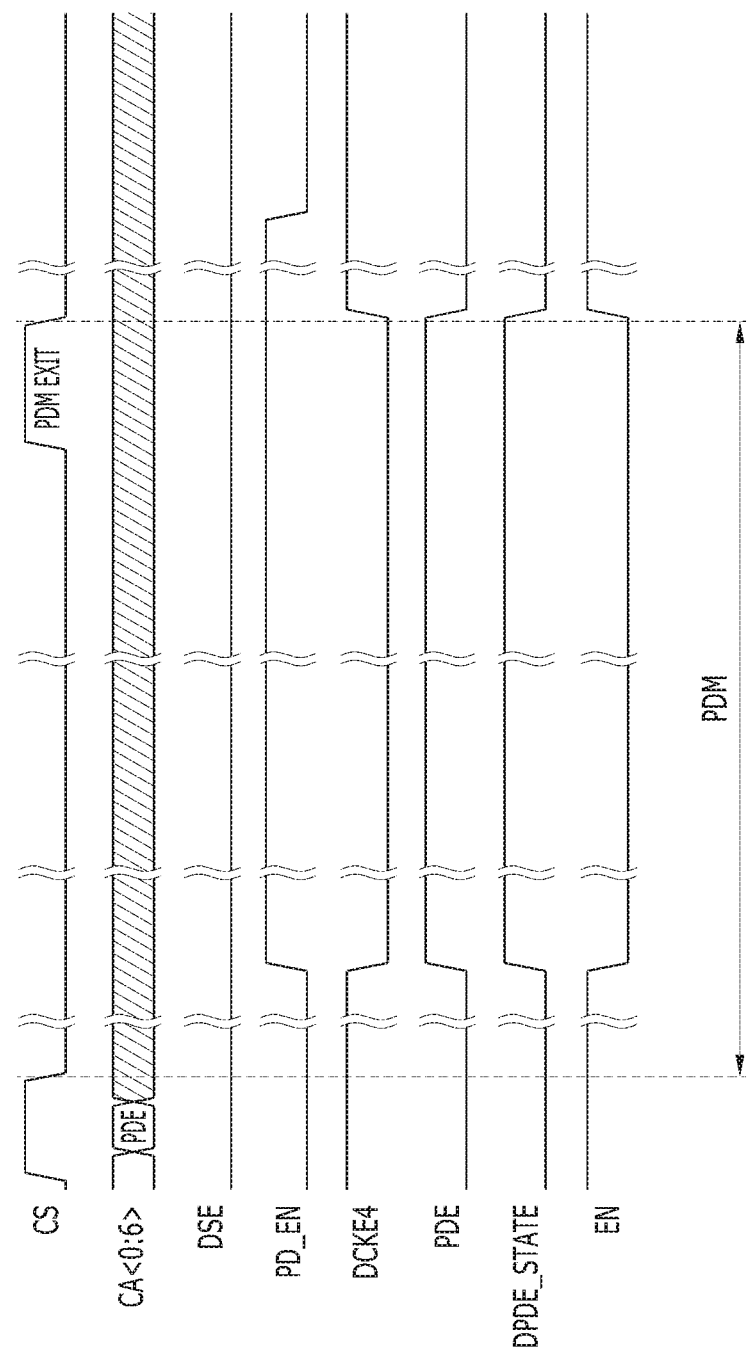

FIGS. 5 and 6 are timing diagrams illustrating an operating method of the semiconductor device 100 when entering the power-down mode PDM shown in FIG. 1.

Referring to FIG. 5, the semiconductor device 100 may independently enter the power-down mode PDM. For example, the first and second buffer circuits 130 and 140 may buffer the first external command signal CS and the second external command signals CA<0:6> which correspond to the power-down mode PDM, respectively, thereby generating the first internal command signal ICS and the second internal command signals ICA<0:6> which correspond to the power-down mode PDM, respectively.

The control circuit 150 may generate the first mode signal DSE corresponding to the deep-sleep mode DSM and the integrated mode signal DCKE4 and inversion integrated mode signal /DCKE4 corresponding to the integrated modes based on the first internal command signal ICS and the second internal command signals ICA<0:6>. For example, the command decoding block 151 may activate the second mode signal PDE based on the first internal command signal ICS and the second internal command signals ICA<0:6> which correspond to the power-down mode PDM and deactivate the second mode signal PDE based on the second mode termination signal PDE_RESET. The command decoding block 151 may continuously deactivate the first mode signal DSE based on the first internal command signal ICS and the second internal command signals ICA<0:6> which correspond to the power-down mode PDM. The integrated mode control block 153 may activate the integrated mode signal DCKE4 and the inversion integrated mode signal /DCKE4 based on the second mode signal PDE, and activate the second mode termination signal PDE_RESET according to the first toggling of the first internal command signal ICS after the integrated mode signal DCKE4 is activated.

In the power-down mode PDM, the first power gating circuit 121 may electrically couple the supply terminal of the power supply voltage VDD to the supply terminal of the first high voltage VDD_internal1 based on the first mode signal DSE which is deactivated. In the power-down mode PDM, the second power gating circuit 123 may electrically disconnect the supply terminal of the power supply voltage VDD from the supply terminal of the second high voltage VDD_internal2 based on the inversion integrated mode signal /DCKE4. In the power-down mode PDM, the third power gating circuit 125 may electrically disconnect the supply terminal of the power supply voltage VDD from the supply terminal of the third high voltage VDD_internal3 based on the inversion integrated mode signal /DCKE4. In the power-down mode PDM, the fourth power gating circuit 127 may electrically disconnect the supply terminal of the ground voltage VSS from the supply terminal of the low voltage VSS_internal based on the integrated mode signal DCKE4. Accordingly, in the power-down mode PDM, the power supply voltage VDD may be supplied to the first internal circuit 111, and at least one of the power supply voltage VDD and the ground voltage VSS may not be continuously supplied to the second and third internal circuits 113 and 115.

The buffer enable circuit 160 may deactivate the buffer enable signal EN based on the integrated mode signal DCKE4 in the power-down mode PDM, and the second buffer circuit 140 may be disabled based on the buffer enable signal EN in the power-down mode PDM.

Referring to FIG. 6, the semiconductor device 100 may dependently enter the power-down mode PDM. In other words, the semiconductor device 100 may enter the power-down mode PDM as the option mode after entering the specific mode, for example, the self-refresh mode SRE. For example, the first and second buffer circuits 130 and 140 may buffer the first external command signal CS and the second external command signals CA<0:6> which correspond to the self-refresh mode SRE, respectively, thereby generating the first internal command signal ICS and the second internal command signals ICA<0:6> which correspond to the self-refresh mode SRE, respectively. Subsequently, the first and second buffer circuits 130 and 140 may buffer the first external command signal CS and the second external command signals CA<0:6> which correspond to the power-down mode PDM as the option mode of the self-refresh mode SRE, respectively, thereby generating the first internal command signal ICS and the second internal command signals ICA<0:6> which correspond to the power-down mode PDM, respectively.

The control circuit 150 may generate the first mode signal DSE corresponding to the deep-sleep mode DSM and the integrated mode signal DCKE4 and inversion integrated mode signal /DCKE4 corresponding to the integrated modes based on the first internal command signal ICS and the second internal command signals ICA<0:6>. For example, the command decoding block 151 may activate the second mode signal PDE based on the first internal command signal ICS and the second internal command signals ICA<0:6> which correspond to the power-down mode PDM, and deactivate the second mode signal PDE based on the second mode termination signal PDE_RESET. The command decoding block 151 may continuously deactivate the first mode signal DSE based on the first internal command signal ICS and the second internal command signals ICA<0:6> which correspond to the power-down mode PDM. The integrated mode control block 153 may activate the integrated mode signal DCKE4 and the inversion integrated mode signal /DCKE4 based on the second mode signal PDE, and activate the second mode termination signal PDE_RESET according to the first toggling of the first internal command signal ICS after the integrated mode signal DCKE4 is activated.

In the power-down mode PDM, the first power gating circuit 121 may electrically couple the supply terminal of the power supply voltage VDD to the supply terminal of the first high voltage VDD_internal1 based on the first mode signal DSE which is deactivated. In the power-down mode PDM, the second power gating circuit 123 may electrically disconnect the supply terminal of the power supply voltage VDD from the supply terminal of the second high voltage VDD_internal2 based on the inversion integrated mode signal /DCKE4. In the power-down mode PDM, the third power gating circuit 125 may electrically disconnect the supply terminal of the power supply voltage VDD from the supply terminal of the third high voltage VDD_internal3 based on the inversion integrated mode signal /DCKE4. In the power-down mode PDM, the fourth power gating circuit 127 may electrically disconnect the supply terminal of the ground voltage VSS from the supply terminal of the low voltage VSS_internal based on the integrated mode signal DCKE4. Accordingly, in the power-down mode PDM, the power supply voltage VDD may be supplied to the first internal circuit 111, and at least one of the power supply voltage VDD and the ground voltage VSS may not be continuously supplied to the second and third internal circuits 113 and 115.

The buffer enable circuit 160 may deactivate the buffer enable signal EN based on the integrated mode signal DCKE4 in the power-down mode PDM, and the second buffer circuit 140 may be disabled based on the buffer enable signal EN in the power-down mode PDM.

In accordance with the embodiments of the present invention, the semiconductor device 100 may support both of the power-down mode and the deep-sleep mode which are related to power gating, thereby minimizing power consumption.

Also, in accordance with the embodiments of the present invention, since the semiconductor device supports both of the deep-sleep mode and the power-down mode even though the number of command/address signals is limited, the size of an occupying area and the design complexity may be reduced due to the limitation of the number of the command/address signals.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

What is claimed is:

1. A semiconductor device, comprising:
   a first internal circuit coupled to first and second voltage terminals for receiving first and second voltages;
   a second internal circuit coupled to the first and second voltage terminals for receiving the first and second voltages;
   a first power gating circuit coupled between at least one of the first and second voltage terminals and the first internal circuit, the first power gating circuit being suitable for disconnecting at least one of the first and second voltages based on a first mode signal in a first mode;
   a second power gating circuit coupled between at least one of the first and second voltage terminals and the second internal circuit, the second power gating circuit being suitable for disconnecting at least one of the first and second voltages based on an integrated mode signal in the first mode and a second mode; and
   a control circuit comprising:
   a command decoding block suitable for generating the first mode signal corresponding to the first mode and a second mode signal corresponding to the second mode based on the one or more command signals, a first mode termination signal, a second mode start signal and a second mode termination signal; and
   an integrated mode control block suitable for generating the integrated mode signal, the first mode termination signal, the second mode start signal and the second mode termination signal based on a first command signal among one or more command signals, the first mode signal and the second mode signal.

2. The semiconductor device of claim 1, wherein the first mode includes a deep-sleep mode, and the second mode includes a power-down mode.

3. The semiconductor device of claim 1, wherein the integrated mode control block determines an activation moment of the first mode termination signal, an activation moment of the second mode start signal, an activation moment of the second mode termination signal and a deactivation moment of the integrated mode signal depending on a number of times that the first command signal toggles when the integrated mode signal is activated.

4. The semiconductor device of claim 1, wherein the integrated mode control block includes:
   a mode enable unit suitable for generating a mode enable signal based on the first mode signal and the second mode signal;
   an integrated mode signal generation unit suitable for generating the integrated mode signal based on the mode enable signal, a toggling detection signal and a mode state signal;
   a detection unit suitable for generating the toggling detection signal and an edge detection signal which correspond to the first command signal based on the integrated mode signal, the first mode signal and the first command signal; and
   a mode state determination unit suitable for generating the mode state signal, the first mode termination signal, the second mode start signal and the second mode termination signal based on the integrated mode signal, the first mode signal and the edge detection signal.

5. The semiconductor device of claim 4, wherein the detection unit is enabled based on the integrated mode signal, detects toggling of the first command signal regardless of the first mode signal to generate the toggling detection signal, and detects an edge of the first command signal to generate the edge detection signal when the first mode signal is activated.

6. The semiconductor device of claim 1, further comprising:
   a first buffer circuit suitable for buffering a first external command signal to generate the first command signal;
   a second buffer circuit enabled based on a buffer enable signal, the second buffer circuit being suitable for buffering one or more second external command signals to generate a second command signal among the one or more command signals; and
   a buffer enable circuit suitable for generating the buffer enable signal based on the integrated mode signal.

7. The semiconductor device of claim 6, wherein the buffer enable circuit deactivates the buffer enable signal when the integrated mode signal is activated, and activates the buffer enable signal when the integrated mode signal is deactivated.

8. The semiconductor device of claim 1, wherein the first internal circuit includes a plurality of logic blocks coupled between a third voltage terminal to which the first voltage is supplied through the first power gating circuit and the second voltage terminal.

9. The semiconductor device of claim 8, wherein the first power gating circuit includes a switching block coupled between the first voltage terminal and the third voltage terminal, and the switching block electrically disconnects the first voltage terminal from the third voltage terminal based on the first mode signal or an inverted signal of the first mode signal.

10. The semiconductor device of claim 1, wherein the second internal circuit includes a plurality of logic blocks coupled between a fourth voltage terminal to which the first voltage is supplied through the second power gating circuit and the second voltage terminal.

11. The semiconductor device of claim 9, wherein the second power gating circuit includes a switching block coupled between the first voltage terminal and the fourth voltage terminal, and the switching block electrically disconnects the first voltage terminal from the fourth voltage terminal based on the integrated mode signal or an inverted signal of the integrated mode signal.

12. The semiconductor device of claim 1, further comprising:
   a third internal circuit coupled to the first and second voltage terminals for receiving the first and second voltages;
   a third power gating circuit coupled between the first voltage terminal and the third internal circuit, the third power gating circuit being suitable for disconnecting the first voltage in the first and second modes based on any one of the integrated mode signal and an inverted signal of the integrated mode signal; and
   a fourth power gating circuit coupled between the second voltage terminal and the third internal circuit the fourth power gating circuit being suitable for disconnecting the second voltage in the first and second modes based on remaining one of the integrated mode signal and the inverted signal of the integrated mode signal.

13. The semiconductor device of claim 12, wherein the third internal circuit includes:

a plurality of first logic blocks coupled between a fifth voltage terminal to which the first voltage is supplied through the third power gating circuit and the second voltage terminal; and a plurality of second logic blocks coupled between a sixth voltage terminal to which the second voltage is supplied through the fourth power gating circuit and the second voltage terminal.

14. The semiconductor device of claim 13, wherein the third power gating circuit includes a switching block coupled between the first voltage terminal and the fifth voltage terminal, and the switching block electrically disconnects the first voltage terminal from the fifth voltage terminal based on any one of the integrated mode signal and the inverted signal of the integrated mode signal.

15. The semiconductor device of claim 13, wherein the fourth power gating circuit includes a switching block coupled between the second voltage terminal and the sixth voltage terminal, and the switching block electrically disconnects the second voltage terminal from the sixth voltage terminal based on remaining one of the integrated mode signal and the inverted signal of the integrated mode signal.

16. An operating method of a semiconductor device, comprising:

electrically disconnecting a first voltage terminal from a first internal circuit and the first voltage terminal from a second internal circuit when the semiconductor device enters a first mode based on one or more command signals;

electrically coupling the first voltage terminal to the first internal circuit and maintaining a state where the first voltage terminal is electrically disconnected from the second internal circuit when the semiconductor device exits from the first mode and enters a second mode based on first toggling of a first command signal among the one or more command signals; and maintaining a state where the first voltage terminal is electrically coupled to the first internal circuit and electrically coupling the first voltage terminal to the second internal circuit when the semiconductor device exits from the second mode based on second toggling of the first command signal.

17. The operating method of claim 16, wherein when the first command signal performs the first toggling, the semiconductor device enters the second mode based on a first edge of the first command signal, and subsequently exits from the first mode based on a second edge of the first command signal.

18. The operating method of claim 16, wherein the first mode includes a deep-sleep mode, and the second mode includes a power-down mode.

19. The operating method of claim 16, wherein buffering command signals other than the first command signal among the one or more command signals inputted from an external device is disabled from when entering the first mode to when exiting from the second mode.

20. A semiconductor device, comprising:

a first internal circuit coupled to first and second voltage terminals for receiving first and second voltages;

a second internal circuit coupled to the first and second voltage terminals for receiving the first and second voltages;

a first power gating circuit coupled between at least one of the first and second voltage terminals and the first internal circuit, the first power gating circuit being suitable for disconnecting at least one of the first and second voltages based on a first mode signal in a first mode;

a second power gating circuit coupled between at least one of the first and second voltage terminals and the second internal circuit, the second power gating circuit being suitable for disconnecting at least one of the first and second voltages based on an integrated mode signal in the first mode and a second mode; and a control circuit suitable for generating the first mode signal corresponding to the first mode based on one or more commands and generating the integrated mode signal based on one or more commands, the first mode signal, and a second mode signal corresponding to the second mode generated based on the one or more commands.

* * * * *